(12) United States Patent
Kang et al.

(10) Patent No.: US 6,977,528 B2
(45) Date of Patent: Dec. 20, 2005

(54) EVENT DRIVEN DYNAMIC LOGIC FOR REDUCING POWER CONSUMPTION

(75) Inventors: Sung-Mo Kang, Santa Cruz, CA (US); Seung-Moon Yoo, Austin, TX (US)

(73) Assignee: The Regents of the University of California, Oakland, CA (US)

( * ) Notice: Subject to any disclaimer, the term of this patent is extended or adjusted under 35 U.S.C. 154(b) by 92 days.

(21) Appl. No.: 10/325,594

(22) Filed: Dec. 20, 2002

(65) Prior Publication Data

US 2004/0041594 A1 Mar. 4, 2004

Related U.S. Application Data

(60) Provisional application No. 60/408,407, filed on Sep. 3, 2002.

(51) Int. Cl.[7] .......................................... H03K 19/096
(52) U.S. Cl. .......................... 326/121; 326/92; 326/28
(58) Field of Search .......................... 326/93–98, 112, 326/119, 121, 26–28

(56) References Cited

U.S. PATENT DOCUMENTS

| | | | | |
|---|---|---|---|---|
| 5,646,573 A | * | 7/1997 | Bayruns et al. | 330/59 |
| 5,831,452 A | * | 11/1998 | Nowak et al. | 326/96 |
| 6,040,716 A | | 3/2000 | Bosshart | |
| 6,060,909 A | * | 5/2000 | Aipperspach et al. | 326/98 |

OTHER PUBLICATIONS

Krambeck, R.H. et al.; "High-Speed Compat Circuits With CMOS," IEEE Journal of Solid-State Circuits, vol. SC-17, No. 3, pp. 614 thru 619, Jun. 1982.
Kang, Sung-Mo (Steve) et al.; "Dynamic Logic Circuits," Chapter 9 from CMOS Digital Integrated Circuits, Analysis and Design, Third Edition, McGraw Hill, New York, New York, Cover page, Bibliographic page, pp. 357 thru 404, (2003).

* cited by examiner

Primary Examiner—Don Le
(74) Attorney, Agent, or Firm—John P. O'Banion

(57) ABSTRACT

Methods and circuits are described for reducing power consumption within digital logic circuits by blocking the passage of clock signal transitions to the logic circuits when the clock signal would not produce a desired change of state within the logic circuit, such as at inputs, intermediary nodes, outputs, or combinations. By way of example, the incoming clock is blocked if a given set of logic inputs will not result in an output change of state if a clock signal transition were to be received. By way of further example, the incoming clock is blocked in a data flip-flop if the input signal matches the output signal, such that receipt of a clock transition would not produce a desired change of state in the latched output. The invention may be utilized for creating lower power combinatorial and/or sequential logic circuit stages subject to less unproductive charging and discharging of gate capacitances.

79 Claims, 9 Drawing Sheets

EVENT DRIVEN DYNAMIC LOGIC FOR REDUCING POWER CONSUMPTION

CROSS-REFERENCE TO RELATED APPLICATIONS

This application claims priority from U.S. provisional application Ser. No. 60/408,407 filed on Sep. 3, 2002, incorporated herein by reference.

STATEMENT REGARDING FEDERALLY SPONSORED RESEARCH OR DEVELOPMENT

Not Applicable

REFERENCE TO A COMPUTER PROGRAM APPENDIX

Not Applicable

BACKGROUND OF THE INVENTION

1. Field of the Invention

This invention pertains generally to digital logic circuitry, and more particularly to reducing power consumption using event driven logic wherein the clock signal is only propagated within the circuit after a true logic operation is performed.

2. Description of the Background Art

Conventional logic circuitry often utilizes a clock signal which is received by various levels of gating within the circuitry for synchronizing the state changes within the circuitry so as to eliminate race conditions and other similar problems. As a result, the clock signal is applied to a number of gates within each logic block or section. A predetermined gate capacitance exists for each gate which is subject to repeated charge and discharge cycles following clock activity. Consequently, circuit power consumption is increased by repetitive charging and discharging, even when no net circuit activity results. Furthermore, clock signal loading can be substantially increased which requires higher power clock sources and additional dissipation.

For example, FIG. 1 depicts a conventional four-input AND gate 10 implemented in CMOS static logic having data inputs 12 and a data output 14. All four inputs 12 (IN1–IN4) must be retained "high" to allow the voltage at node A to discharge to $V_{SS}$ (logic state="low") through transistors 16a, 18a, 20a, 22a, while transistors 16b, 18b, 20b, 22b, are retained in an off state. With node A driven low at the input of inverter 24, signal output OUT 14 transitions to $V_{DD}$ (logic state="high"). It should be noted that CMOS static logic is considered extremely stable and is in widespread use within conventional circuit designs, particularly within integrated circuits. One drawback of this static topology is that each input signal is gated to both PMOS and NMOS transistors, thereby subjecting the inputs to large gate load capacitances and their associated charge delays.

To improve the speed of CMOS static logic, various kinds of dynamic logic have been proposed. The purpose of these proposed designs is to minimize gate loading and to control circuit operation in response to a clock signal. Dynamic logic circuits also provide a ready means of synchronizing signal state changes between various logic stages within a digital logic section or device.

FIG. 2 depicts a conventional four-input AND gate 30 implemented with dynamic logic which is generally referred to as "domino" logic. Inputs 32 (IN1–IN4) are connected to transistors 36, 38, 40, 42 respectively. A clock signal CLK 44 is connected to complementary transistors 46, 48. The output inverter 50, with a keeper circuit 52, drives output signal OUT 34. In response to CLK going low, node A and output signal OUT 34 are precharged at $V_{DD}$ (high) and $V_{SS}$ (low) levels, respectively. It will be noted that since transistor 48 is held inactive during precharging, the state of the inputs does not affect precharging of node A.

The precharging is performed during a clock phase referred to as a "precharge phase" which occurs in the depicted circuit while the clock is held in a low state. It should be appreciated, however, that the precharge clock phase may be of either polarity and subject to other conditions, depending upon circuit implementation.

Circuit element 52 is implemented as a "keeper" circuit to maintain the voltage of node A. The "keeper" shown is preferably implemented using a small transistor 52 that exhibits a higher on-state resistance than the other transistors driving node A, thereby allowing its state to be over-ridden.

Upon clock signal CLK 44 transitioning to a high state, an evaluation phase is entered within which the state of the inputs is readily reflected in data output 34. Consider the case of satisfying the AND logic configuration with all inputs 32 being held high as the evaluation phase is entered. Node A is discharged to low through transistors 36–42, 48 whereupon output signal OUT 34 switches to high. If any inputs 32 are held low as the evaluation phase commences, then node A is retained high and output signal OUT 34 remains low.

Each input is gated to a single NMOS transistor, wherein the resultant gate load capacitance is smaller than that provided by conventional CMOS static logic as depicted in FIG. 1. As the mobility of electrons is typically faster than that of holes by more than a factor of two, the size of NMOS transistors is also typically less than half the size of their PMOS transistor counterparts. Therefore, the effective gate load capacitance of dynamic logic can be approximately one-third of that exhibited by static logic. As a consequence of reducing gate load capacitance, dynamic logic can operate at significantly higher clock rates than similar CMOS static logic. A typical dynamic circuit can operate approximately thirty percent (30%) faster than a substantially equivalent static circuit. However, dynamic logic circuits are subject to high power consumption levels.

Considering the operation of dynamic circuit 30 of FIG. 2, it will be noted that at the falling edge of clock signal CLK 44, the gate of transistor 46 is discharged by clock signal CLK 44, thereby activating transistor 46 to precharge node A. Similarly, the gate of transistor 48 is discharged to deactivate transistor 48, wherein charge current is driven to node A regardless of the state of output OUT 34. Consider the case where inputs IN1, IN2 and IN3 are being held high while input IN4 is held low during the evaluation phase (i.e. CLK is high). As a result of transistor 42 remaining in an off state, a non-satisfied AND condition exists, wherein the voltage of node A is not discharged and remains at the precharge level $V_{DD}$ (high). However, upon clock signal CLK 44 transitioning low, transistor 46 is switched-on to charge node A toward $V_{DD}$ while the gate capacitance of transistor 48 is discharged. This circuit illustrates that even without circuit activity, the capacitance associated with transistors 46 and 48 are being charged or discharged when clock input CLK 44 transitions either low or high.

It should therefore be appreciated that in conventional dynamic logic circuitry, as described, the clock signal (CLK) repeatedly charges and discharges a number of gate capacitances whether or not the state of the logic circuit is subject to change. As a result, power is always consumed within a dynamic logic stage subject to receipt of an active clock. It should be appreciated that with regard to the four input AND gate shown in FIG. 2, the probability of circuit activity that may result in a change of the output signal is one out of sixteen (assuming equal input probabilities). As a result, power is consumed unnecessarily by the clock without any circuit operation for fifteen out of the sixteen possible input combinations. It should be appreciated that this "inactive" mode power consumption may be larger or smaller than in the four input AND gate example and is dependent upon the circuit configuration (i.e. number of inputs, gating, use of additional combinatorial circuits and sequential circuits, and so forth) and signal activity within the given application.

FIG. 3 exemplifies a sequential logic circuit 70 to illustrate that clock signal related power losses are also common problems within sequential logic circuits. A conventional flop-flop device 70 (D-FF) is depicted in the figure having a data input D 72 and a clock signal input CLK 74, while complementary outputs Q 76 and Q-bar 78 are provided.

During flip-flop operation, as clock signal CLK 74 goes low, node X is precharged to $V_{DD}$ (high) through transistor 80. An inverted clock signal is also generated from clock signal CLK 74 propagating through an odd number of inverters 82, 84, 86. An OR'ed grouping of transistors 80, 88 and 90 can provide for charging of node X, while an AND'ed series of transistors 92, 94 and 96 can operate to control the discharging of node X. A latching section is shown comprising four transistors 98, 100, 102, 104 that operate in response to clock signal CLK 74 and the state of charge of node X to drive an output stage having inverters 106, 108.

After clock signal CLK 74 transitions to low, the inverted clock signal CLKD-bar transitions to high following the inverter propagation delay, whereupon transistor 96 and transistor 104 switch to an on state. Output data is driven by transistor 98 in conjunction with inverter 106 and 108 preferably implemented as a "keeper".

First, the situation is considered in which the latched data at node Q 76 is low, as set by a previous cycle, while the input signal D is held high. In response, transistor 94 is retained in an on state, whereupon as clock signal CLK 74 transitions high entering the evaluation phase, transistor 92 and transistor 100 are switched-on and node X is discharged toward $V_{SS}$ (low) through transistors 92, 94 and 96 until transistor 96 is switched-off following the propagation delays associated with inverters 82, 84, 86. As node X is discharged, transistor 98 is switched-on and node Q 76 and Q-bar 78 transition to high and low, respectively. When the latched data output is being held high as data input D 72 is retained low, node X remains at the precharged high level (VDD) because transistor 88 is switched-on and transistor 94 is switched-off. When clock signal CLK 74 transitions to a high, then node Q 76 is discharged to $V_{SS}$ (low) through transistors 100, 102, 104 until CLKD-bar transitions to low following the inverter propagation delays. Consequently, the latched data at node Q 76 is switched high to low and Q-bar transitions to high.

This D flip-flop circuit would be operable at sufficiently high frequencies to allow implementation of high frequency pipeline architectures. Unfortunately, the substantial power losses which arise within the dynamic logic circuits as a consequence of repetitive charging and discharging make the circuit generally less desirable for these applications.

It will be appreciated that in the case where clock signal CLK 74 transitions to high (evaluation phase), when the latched data is high and data input D is also high, then node X is discharged to $V_{SS}$ (low) and node Q is connected to $V_{DD}$ (high) through transistor 98. However, as the latched data is already high, no net circuit activity is occurring as a result of the operation of transistor 98, and yet the clock signal CLK 74 must still charge the gate capacitances of transistors 92, 100. In addition, when clock signal CLK 74 transitions to low, the gate capacitances of transistor 92 and transistor 100 are discharged and the delay pulse circuit is activated to charge the gate capacitance of transistors 96, 104. These operations are repeated even though the output data remains unchanged (high) while the clock signal CLK 74 is running. As a result, a substantial percentage of the operating power is unnecessarily consumed by the unproductive activity of clock signal CLK 74, which is subject to loading even when no desired circuit state changes occur.

It has been shown that both combinatorial and sequential logic circuits are similarly subject to capacitive loading of the clock signal, wherein circuit power is consumed even when no net (productive) circuit activity is occurring.

Therefore, a need exists for a logic circuit that exhibits lower gate capacitance losses in response to the activity of a dynamic clock signal, wherein overall circuit operating power may be reduced. The present invention satisfies those needs, as well as others, and overcomes the deficiencies of previously developed dynamic clocking methods and circuits.

BRIEF SUMMARY OF THE INVENTION

The present invention comprises a method and apparatus for reducing power consumption within digital logic circuits which may be utilized in combinatorial and/or sequential logic circuits. By way of example, and not of limitation, by reducing the relative activity of the clock input signal as applied to the clock inputs of the digital logic circuits, the capacitive loading is thereby reduced with attendant reductions in power consumption. The invention recognizes that logic circuits are typically only subject to changing output conditions for a small number of the given input and intermediary conditions for which a clock signal transition may be received.

It will be appreciated that a number of prior art circuits (i.e. dynamic combinatorial circuits) use the receipt of a clock signal to reduce the gate loading and associated propagation delays for each data input. By contrast, the present invention modulates when the clock signal is subject to the loading imposed by input and intermediate circuit elements which are driven by the clock. Clock signal availability is modulated by a clock path control circuit based on whether transferring the clock signal through the clock path control circuit to the logic circuit would lead to a desired (productive) change of state. In particular, the clock signal is blocked by the clock path control circuit if a true logic evaluation of the states within the digital logic circuit indicate that transferring the clock signal through the clock path control circuit would not produce a desired change of state, such as an output state change, or advancing the internal state of a sequential logic circuit (i.e. multi-stage counter).

It will be appreciated that a digital logic circuit as defined herein comprises at least one input connected to intermediary circuitry that includes combinatorial and/or sequential elements from which at least one output is generated. The true logic evaluation comprises a logic evaluation of the current states and nodes of the circuit including inputs, intermediary sections, and outputs. The logic evaluation determines whether transferring the clock signal in response to its current state can lead to a desired change of state for the digital logic circuit.

More specifically, in considering an example of a combinatorial digital logic circuit, the clock signal is blocked, such as by a pass transistor, if the current combination of input states would not alter the current output state upon receipt of a clock transition. With regard to a sequential logic circuit, the clock signal is blocked if receipt of the clock signal could not contribute to the advancement of the state of the sequential circuit from its current input and intermediary states toward a new output state. The phrase "toward a new output state" as used herein means that the data output states may not necessarily change, but that internal state changes may arise that subsequently may lead to a new output state. In considering the case of a simple data flip-flop implemented with event driven logic according to the present invention, the clock signal would only be transferred to the flip-flop circuit from the clock path control circuit when the data input differs from the latched output.

Evaluation within the circuit may be performed in a number of alternative ways according to the present invention and can often be implemented with minor circuit overhead. It should also be appreciated that effective power reductions may be achieved even if the clock is blocked for only a portion of the circuit states for which receipt of the clock signal would prove unproductive, and thereby not lead to a desired change of circuit state.

According to an aspect of the present invention, the clock input of a circuit is blocked for a portion of the states to which the circuit is subject, such as in response to conditions at the circuit input, output, or intermediate nodes therein. As a result the circuit, or circuit stage, operates at a lower power dissipation because a number of gates tied to the clock input signal are no longer subject to capacitive charge and discharge cycling for each clock transition being received. It should also be appreciated that power savings can also accrue from eliminating state changes within intermediate circuits that do not advance the state of the circuit toward an output transition. An example of such intermediary state changes being the inverted and delayed clock signal CLKD-bar described in relation to FIG. 3, in addition with other associated intermediary charging and discharging that do not result in an output transition.

The invention may be generally described in terms of an apparatus for reducing power consumption in a clocked digital logic circuit wherein a clock path control circuit is configured for blocking the passage of a clock signal to the clocked digital logic circuit as a function of the feedback received. For example, the clock may be passed only when the feedback received indicates that a desired change in state in the data output will arise in response to the receipt of the clock signal for a given data input of the clocked digital logic circuit. The clock path control circuit generally comprises a switching circuit for selectively blocking the clock signal following modulation provided by a detection circuit that is responsive to conditions at the inputs of the clocked digital logic circuit. In this way the clock signal is blocked upon detecting that a change of state within the clocked digital logic circuit could not arise in response to the receipt of the clock signal, whereby blocking of the clock signal has no effect on circuit state while it lowers power dissipation and loading of the clock signal.

According to another aspect of the invention, the invention may be implemented within a dynamic logic circuit comprising a first logic circuit, a second logic circuit receiving a clock signal through the first logic circuit, and a means for blocking passage of a clock signal within the first logic circuit to the second logic circuit as a function of feedback received from the second logic circuit. The clock signal typically controls the selection of precharge and evaluation phases within the second logic circuit using complementary circuits, which may be considered a gating circuit connected to data inputs. The clock signal being only passed to the second logic circuit if it can effect a desired change of state within the second logic circuit. The second logic circuit may comprise a combinatorial and/or sequential logic circuit. Both the first and second logic circuit may comprise a plurality of interconnected switching elements configured for executing a logic function. The means for blocking the clock signal may comprise a switching circuit and a detection circuit. The switching circuit enters a high impedance mode to block the clock signal when its state is modulated by the detection circuit which determines that receipt of the clock would not alter the output of the second logic circuit. Switching elements and switching circuits are typically implemented as one or more transistors, such as within an integrated circuit in which the transistors are fabricated using one or more predetermined device fabrication processes (i.e. NMOS, CMOS, and so forth). The clock signal is preferably blocked by isolating the clock signal by a pass transistor which enters a high impedance mode while pulling the clock input of the second logic circuit to a given nominal state to prevent sensing a false clock signal from a floating clock input.

A level shifter circuit, such as a transistor with a limited bias, can be utilized to reduce the signal levels of the clock signal passed through the first logic circuit to the second, wherein power dissipation and clock signal loading may be further reduced. By way of example, level shifting may be accomplished by using a transistor configured with a predetermined bias voltage (i.e. for FET devices) or current (i.e. for Bipolar devices) to limit the clock signal current flow.

The detector which modulates the state of clock signal blocking determines whether to block, or pass, the clock signal based on the condition of one or more intermediate or output states found within the second logic circuit, or a comparison between inputs, outputs, and intermediate states. A switching circuit may be activated by the detector in view of the circuit states, comparisons, or relationships therein, to pass the clock signal, such as through a low impedance active state of a transistor, to the second logic circuit.

In considering a generally combinatorial dynamic logic circuit, the invention can be implemented as a circuit comprising: (1) at least one transistor for receiving a data signal from at least one data input; (2) a gating circuit coupled to the output of the transistor which is configured for receiving a clock signal on a clock input to trigger a change of state in a data output based on the data input; and (3) a clock blocking circuit configured to selectively prevent the passage of the clock signal to the gating circuit in response to the state of the data output. The device may be configured with a single data input, such as to a single transistor for implementing inverting and non-inverting buffers, or may utilize multiple data inputs according to a logic function relating the multiple inputs. It will be appreciated that a number of different combinatorial logic functions may be implemented according to the present invention including AND gate, NAND gate, OR gate, NOR gate, XOR gate, coincidence gate, and combinations thereof in response to the relationships between the data inputs.

It should be appreciated that the invention may be utilized with combinatorial circuits, sequential circuits, or combinations thereof. In considering the case of a sequential circuit, a dynamic logic circuit according to the invention may generally comprise: (1) a bistable circuit having at least one data output responsive to a data signal received on a data input when triggered by a clock signal transition on a clock input; wherein the bistable circuit is configured for retaining and generating a logic state as previously set in response to the state of the data input as triggered (loaded) in response to the previous receipt of a clock input transition; and (3) a clock path control circuit coupled to the bistable circuit and configured to block the receipt of the clock signal transition in response to the relationship between the signals at the data input and the data output. One relationship is that of equivalence, such as found within a D flip-flop, wherein the clock is not passed to the bistable circuit if the input matches the output. Similar flip-flops, or other forms of latches, may be implemented using event driven logic as described herein which provides power savings and reduces clock signal loading.

It should also be appreciated that clock path control circuits according to the invention may be utilized with complex combinatorial and sequential circuit sections. In these cases feedback may be received from data inputs, intermediary states, data outputs, and relationships between various inputs, outputs and intermediary states, for selecting the modulation of the clock signal received by the complex combinatorial and sequential circuit section.

The present invention may also be generally described as a method of lowering power dissipation in a digital logic circuit stage configured for receiving a clock signal on a clock signal input for triggering state transitions within said digital logic circuit stage, comprising: (1) determining that state transitions within the digital logic circuit stage could not occur in response to receiving a clock signal on the clock signal input under a given set of conditions within the digital logic circuit stage; and (b) isolating the clock signal from the clock signal input of the digital logic circuit stage in response to at least a portion of the conditions for which the state transitions within the digital logic circuit stage could not arise.

The method may be described in relation to the conditions under which the clock signal is blocked, as above, or described according to the conditions within which it is passed. Accordingly, the method may be similarly described as comprising: (1) detecting conditions within the digital logic circuit stage under which circuit activity may occur in response to receiving a clock transition; and (2) allowing the clock transition to be passed to the digital logic circuit stage in response to the conditions being detected, whereby overall gate capacitance loading associated with the clock transitions are reduced.

The inventive circuits and methods described herein may be implemented on circuits fabricated by a number of different process technologies, and within a variety of circuit types including discrete logic elements, gate arrays, programmable logic, microprocessors, memories, digital signal processors, and other circuits utilizing digital logic circuitry, including digital circuits incorporated within power circuitry, analog devices, MEMs devices, and so forth.

An aspect of the invention is to provide a logic circuit architecture exhibiting reduced levels of power dissipation.

Another aspect of the invention is to provide a method for reducing power losses within logic circuits that may be implemented in various fabrication processes, including NMOS, CMOS and other device processes.

Another aspect of the invention is to provide a method for reducing power losses that may be incorporated within logic stages adapted to fulfill various combinatorial and/or sequential logic functions.

Another aspect of the invention is to provide a logic circuit power reduction method that may be readily implemented within conventionally fabricated circuits.

Further aspects and advantages of the invention will be brought out in the following portions of the specification and claims, wherein the detailed description is for the purpose of fully disclosing preferred embodiments of the invention without placing limitations thereon.

BRIEF DESCRIPTION OF THE DRAWINGS

The invention will be more fully understood by reference to the following drawings which are for illustrative purposes only.

DETAILED DESCRIPTION OF THE INVENTION

Referring more specifically to the drawings, for illustrative purposes the present invention is embodied in the apparatus generally shown in FIG. 4 through FIG. 9. It will be appreciated that the apparatus may vary as to configuration and as to details of the parts, and that the method may vary as to the specific steps and sequence, without departing from the basic concepts as disclosed herein.

Figure 1:
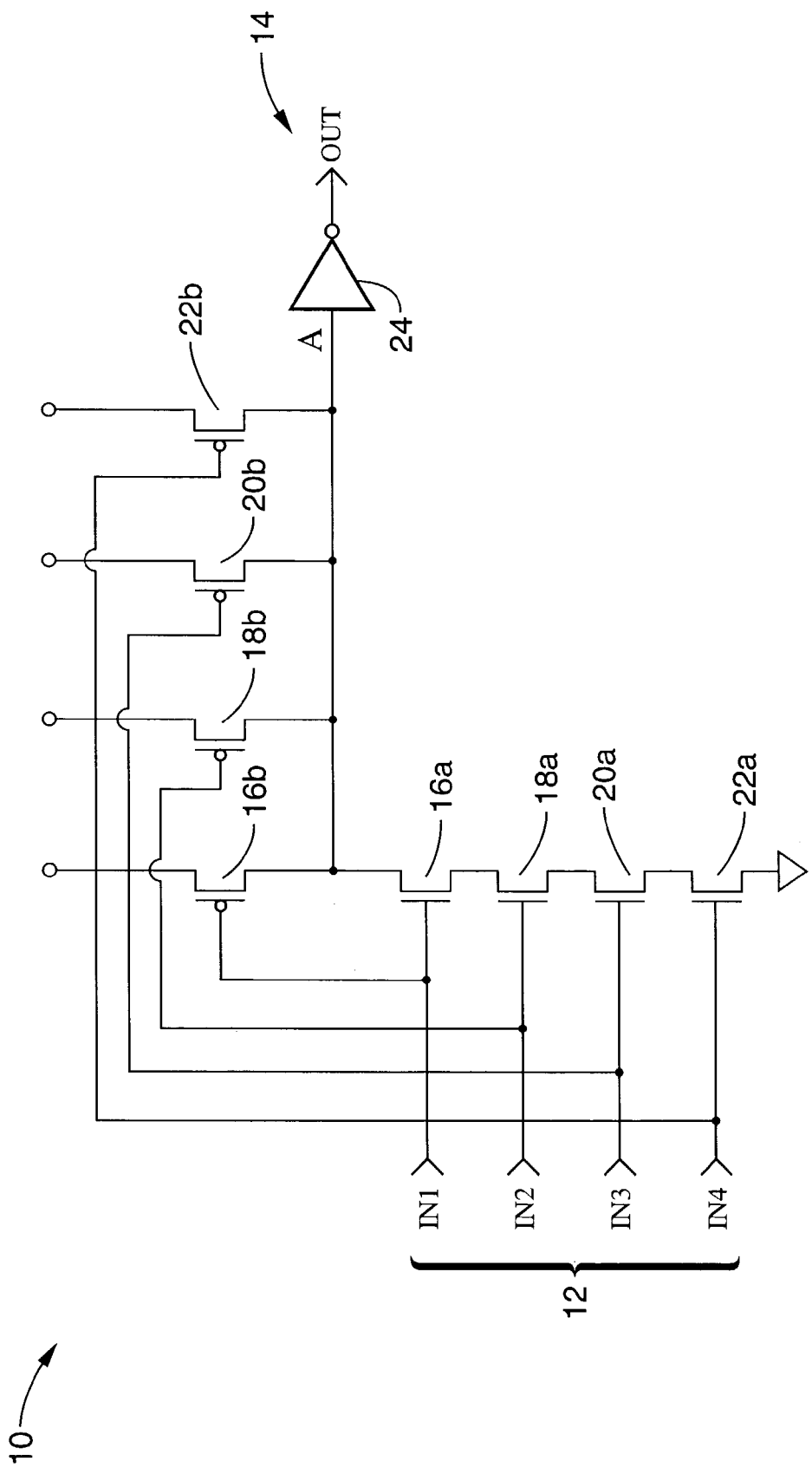
FIG. 1 is a schematic diagram of a conventional four input AND gate implemented in static CMOS logic.
Figure 2:
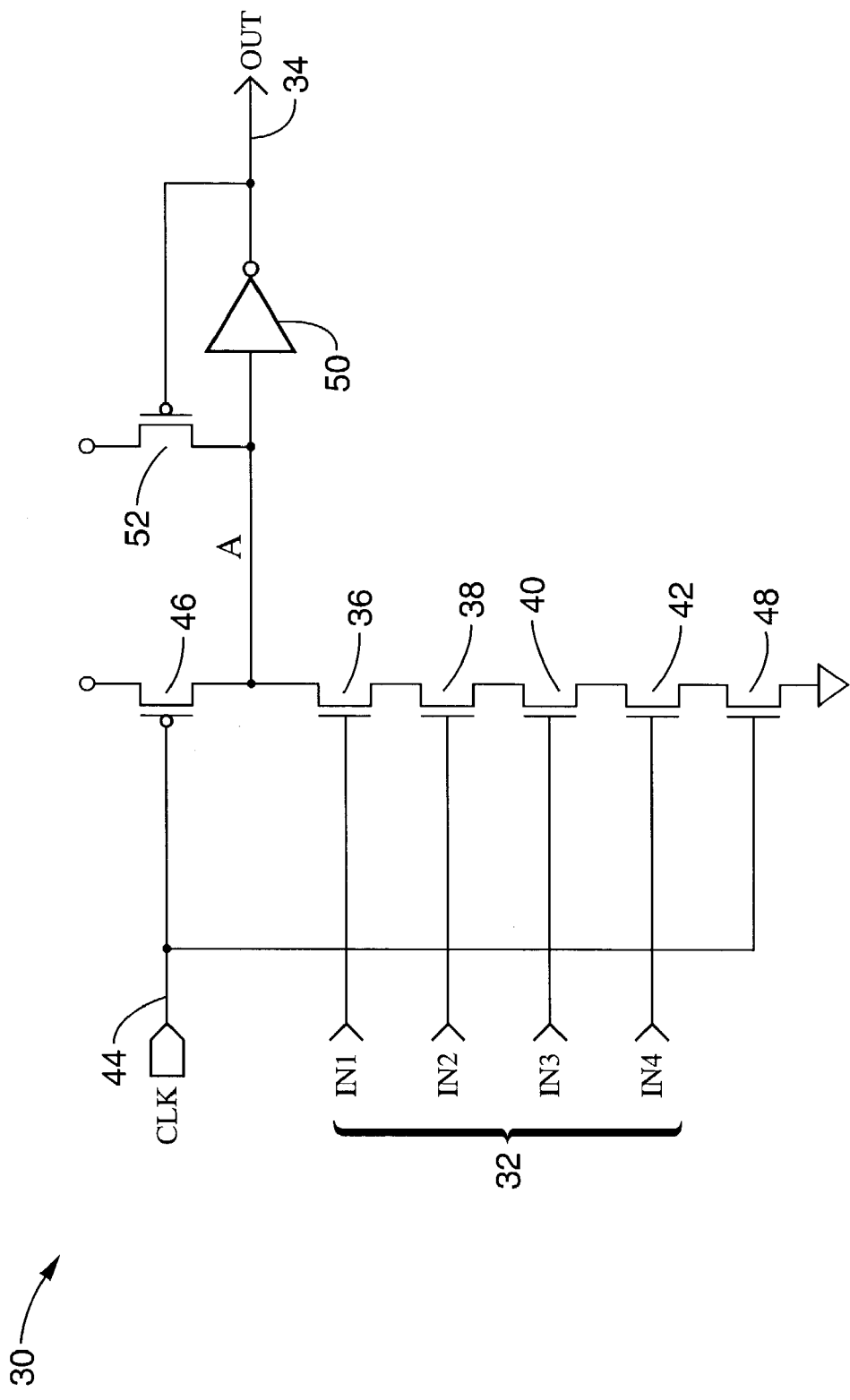
FIG. 2 is a schematic diagram of a conventional four input AND gate implemented in dynamic logic.
Figure 4:
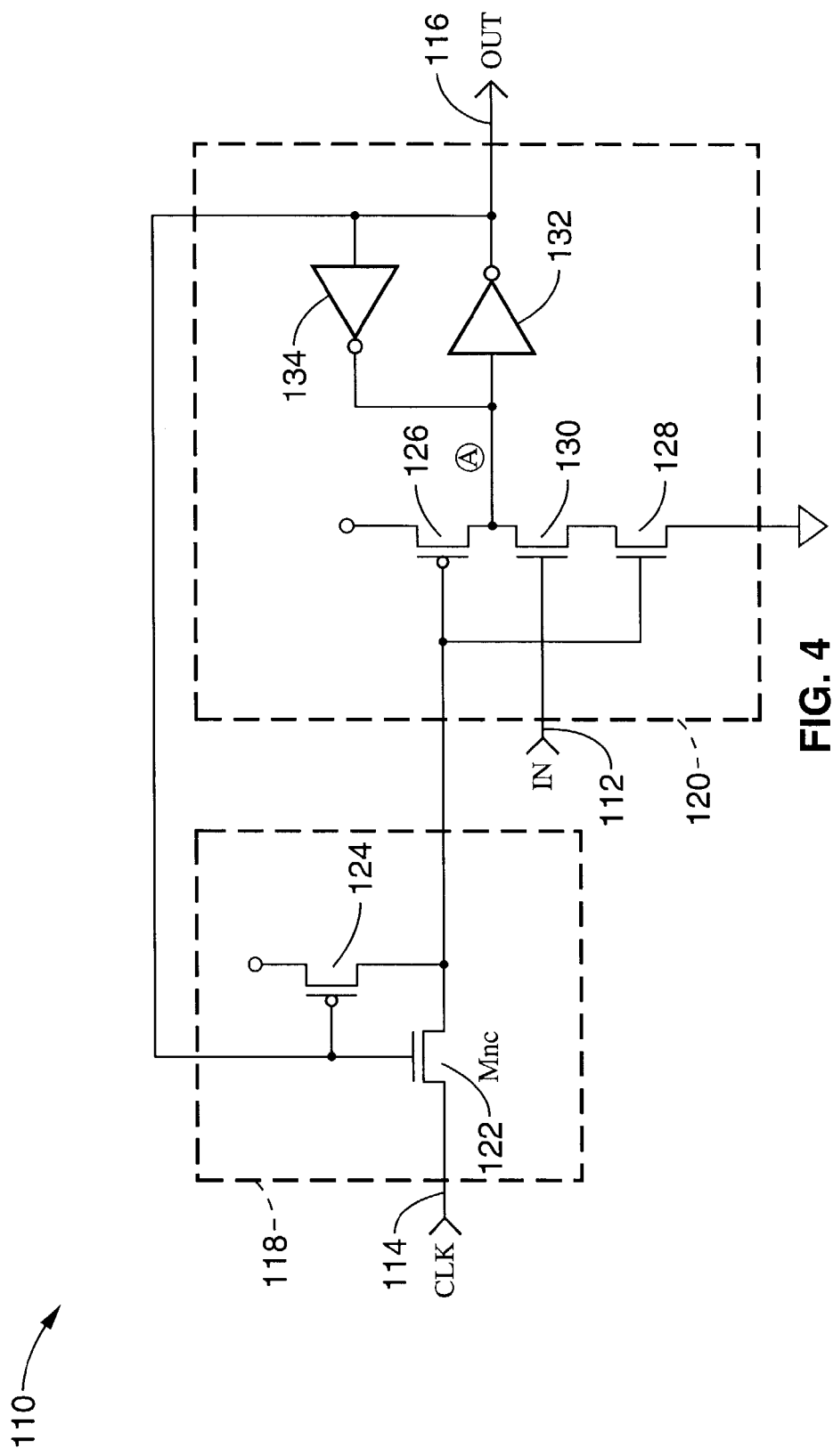
FIG. 4 is a schematic diagram of a single input logic circuit stage according to an embodiment of the present invention, shown utilizing a clock path control circuit to reduce losses associated with the charging and discharging of gate capacitances.

FIG. 4 exemplifies a one input event driven logic circuit 110, similar to the four input AND domino combinatorial logic circuit shown in FIG. 2. Logic circuit 110 has a logic input 112, clock input 114, and output 116. A clock path control circuit 118 is shown for selectively blocking clock signal 114 from a generally conventional dynamic logic circuit 120 in response to a true logic evaluation.

The general operation of the present method involves cycling the logic circuit through clock phases which include precharge and evaluation phases while an active clock signal is being received. The clock signal is preferably received by complementary circuits, typically complementary transistors, that charge a circuit node from a first circuit during precharge, and then allow the charge to be dissipated or held on the node during said evaluation phase through a second circuit in response to the received clock signal.

Considering the case in which output 116 is held high as clock 114 transitions low to commence a precharge phase. Transistor 126 switches on while transistor 128 switches off, causing charge buildup on node A regardless of the state of input 112. Node A charges up to the logic threshold of inverter 132 (overcoming the opposing current provided by inverter 134), whereupon inverter 132 switches states to drive output 116 to low, thereby switching off pass transistor 122 to block clock signal transfer and switching-on pull up transistor 124 to hold the clock input of the logic circuit high. The evaluation phase has therefore been entered automatically regardless of the true state of clock signal CLK 114.

Within the evaluation phase, transistor 128 is switched-on and transistor 126 is switched-off, wherein the setting of input 112 determines the output 116 in response to the precharge. Specifically, a high on input 112 discharges node A resulting in a high on output 116, while a low on input 112 allows node A to remain at a high level of precharge, as retained by inverter 134 ("keeper"), wherein the output 116 remains low holding clock pass transistor 122 in an off state.

It will be appreciated that logic circuit 120 is isolated from transitions of clock signal 114 for as long as input 112 remains low, thereby matching output 116. Within this state, if input 112 should transition to high then node A will be discharged causing a transition of output 116 to high, thereby unblocking clock signal 114 allowing a subsequent precharge phase. It will be appreciated that reduced power consumption has been achieved in a number of ways from using the selective blocking of the clock signal provided according to the present invention.

Figure 5:
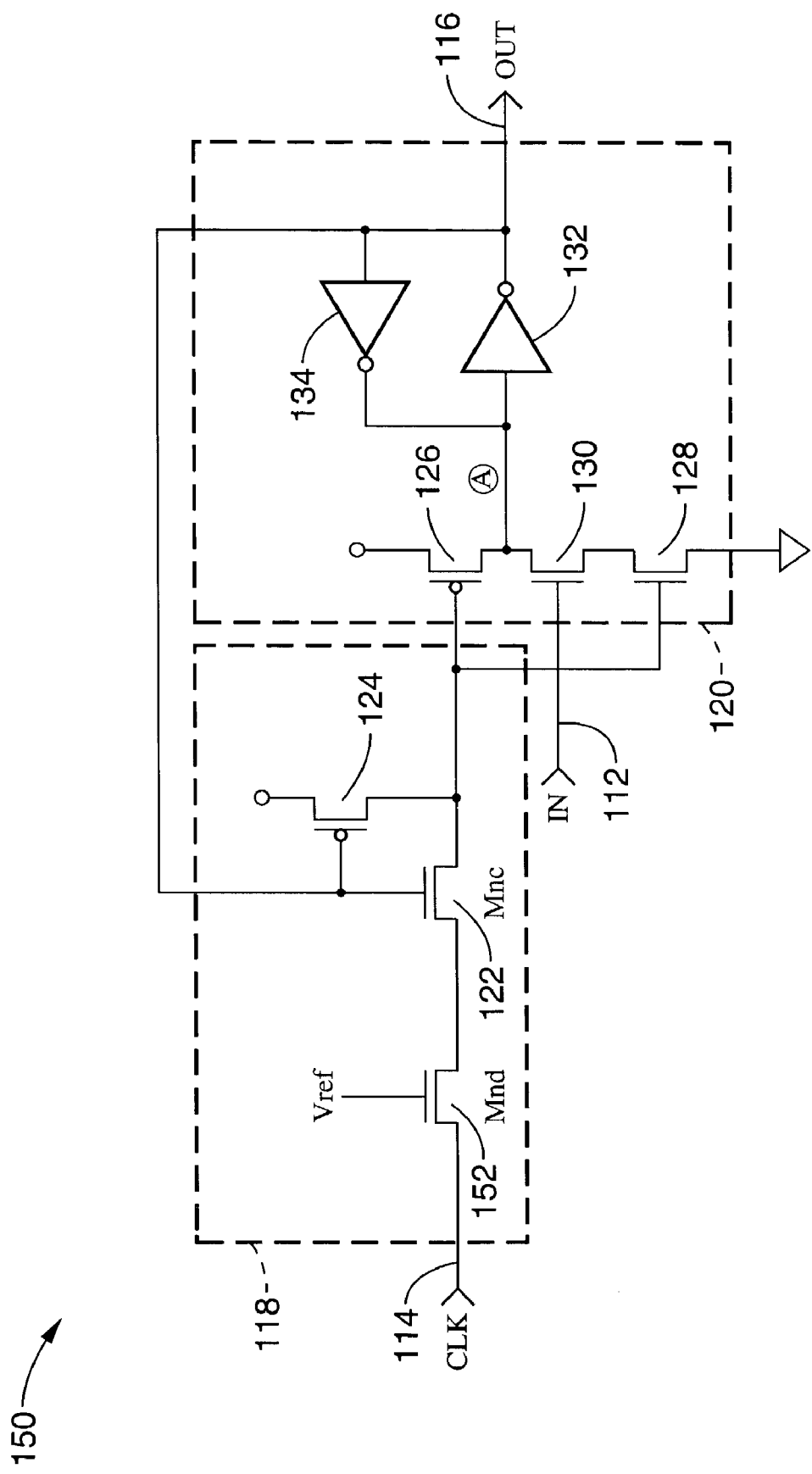
FIG. 5 is a schematic diagram of a single input circuit stage according to another embodiment of the present invention, shown utilizing a clock path control circuit as depicted in FIG. 4 with additional circuitry for controlling clock signal amplitude.

FIG. 5 depicts a clock path control circuit 118 including means for reducing the signal amplitude of clock signal 114, to reduce capacitive power losses when the clock is active. By way of example, the means for reducing clock amplitude is depicted as transistor 152 whose gate is connected to reference voltage $V_{ref}$. It should be appreciated that any convenient level shifting circuit may be utilized within the invention for reducing the signal amplitude of clock signal 114.

Figure 6:
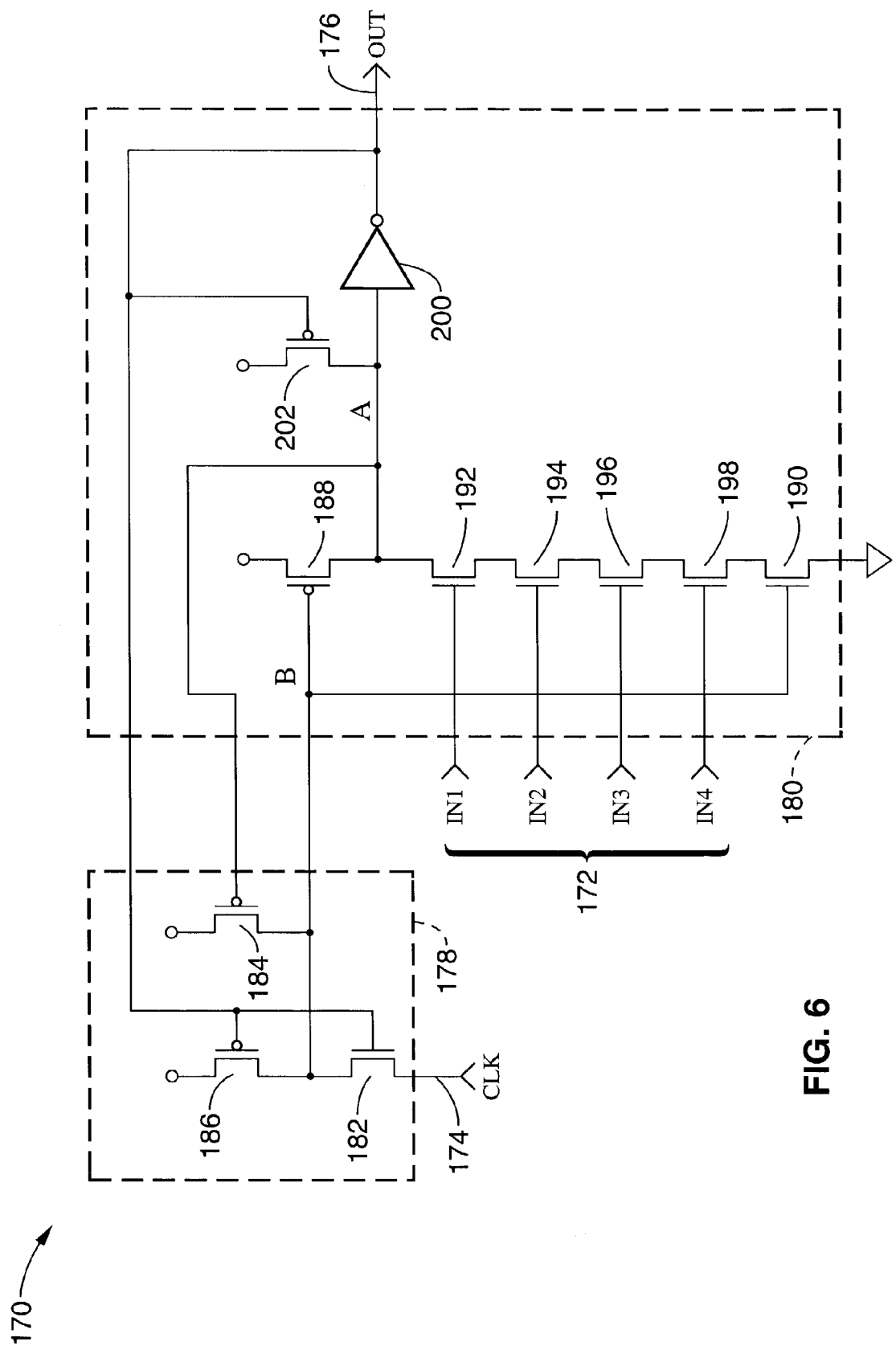
FIG. 6 is a schematic diagram of a four input AND gate according to an embodiment of the present invention, shown utilizing a clock path control circuit to reduce losses associated with the charging and discharging of gate capacitances.

FIG. 6 exemplifies an implementation of event-driven dynamic digital logic circuit 170, in which at least a portion of the unnecessary power consumption associated with unproductive clock activity is eliminated. The dynamic logic portion of this circuit is the same as that described for FIG. 2, however, it has been modified by adding a clock path control circuit according to the present invention. The resultant event driven digital logic circuit 170 has logic inputs 172, a clock signal CLK 174, and an output 176. A clock path control circuit 178 regulates the communication of clock signal CLK 174 to logic circuit 180. Clock path control circuit 178 is depicted with a clock pass transistor 182 and pull up transistors 184, 186. Clock signal CLK 174 is received within logic circuit 180 by complementary transistors 188, 190. Input signals 172 are received by transistors 192, 194, 196, 198 in a series "AND" function configuration. Circuit output 176 is driven by inverter 200 with a keeper circuit 202.

In the precharge phase (when CLK is low) node A and output OUT 176 are precharged at $V_{DD}$ (high) and $V_{SS}$ (low), respectively. Therefore, node B is precharged high through transistor 186. When all inputs are high at the rising edge of clock signal 174, then node A is discharged to low and output OUT 176 goes to high as in a conventional dynamic logic circuit. After node A is discharged to low, node B is maintained high by transistor 184 to eliminate a floating condition at node B. Transistor 184 provides limited conductance (i.e. such as by virtue of reduced transistor width) allowing sufficient current to flow for retaining the voltage at node B without hindering precharge operations. As clock signal CLK 174 transitions low into precharge mode, node B is discharged to a low state because transistor 182 is switched-on. Therefore, in relation to the evaluation phase of the clock, the operation of this event driven circuit is the same as that of conventional dynamic logic, with no speed penalty being incurred.

When any one of the inputs 172 are held low upon entry into the evaluation phase (clock transitioning back to high) node A will not be discharged and will remain high at the precharge voltage ($V_{DD}$), while the output OUT 176 will be driven low. Consequently, the clock input is blocked and node B is maintained high. Therefore, transistor 186 is held active while transistors 182, 184 are off.

Under these conditions with pass transistor 182 off, as clock signal CLK 174 transitions to low, no discharging and charging of gate capacitances will occur as a result of the clock transitions, thereby saving power over a conventional implementation of dynamic logic. It should be appreciated that clock signal CLK 174 is only communicated to the dynamic logic after all inputs of the combination are satisfied (for the depicted "AND" function) and true logic evaluation is performed. The true logic evaluation determines whether a true change in state can arise in response to a clock transition. A true change in state is a change in state that is necessary for the functioning of the circuit, precluding incidental changes of state that occur in response to the clock that are otherwise unproductive. As a result of limiting communication of the clock signal, precharge cycles only occur in response to logic inputs 172 satisfying the functional condition. It should be appreciated that the circuit is not subject to the unproductive charging and discharging of gate capacitances tied to clock signal CLK 174 which wastes device power. For the remaining input combinations, the clock path to node B remains blocked (isolated) with no power being consumed by clock signal CLK 174 as it transitions between precharge and evaluation cycles.

By eliminating unnecessary clock power consumption, overall power consumption is reduced within this dynamic circuit 170 modified for being event driven according to the invention. The amount of power savings for the event driven circuit depends on the depth of stacking within the circuit. For example, more power may be saved on a four input AND circuit than with a three input AND circuit. It should also be appreciated that power is saved not only in a single logic stage but also in a logic block. For example, only about twenty percent (20%) of the logic stages are activated in a typical 32-bit adder for a typical input combination. In the adder implemented with conventional dynamic logic, all logic stages consume clock power. By contrast, an adder implemented with the event-driven dynamic logic according to the invention operates at reduced power levels because only the active twenty percent (20%) of the logic stages consume clock power. Therefore, overall power consumption can be reduced by implementing logic circuits with the event driven logic of the present invention. For the example case of a 32-bit adder, approximately eighty percent (80%) of the clock power is saved using event driven logic. Because clock power consumption accounts for about half of the total operating power consumption within a circuit, it follows that about a forty percent (40%) total reduction in operating power consumption can be provided by utilizing event driven logic circuits according to the present invention.

The event driven logic of the present invention may be applied to sequential logic circuits in addition to the combinatorial logic described. By way of example, the event driven logic of the invention may be applied to create an event driven flip-flop, in which unnecessary clock power consumption is eliminated. The basic premise, as applied to the flip-flop circuit, eliminates unnecessary clock power consumption when the data held at the input is identical with the latched data within the flip-flop from a previous cycle. Selective clock blocking within the present invention may be generalized wherein if the conditions of the digital logic circuit indicate that a desired state change will not arise as a result of clock transitions, then the clock signal may be blocked from the digital logic circuit to save power.

Figure 7:
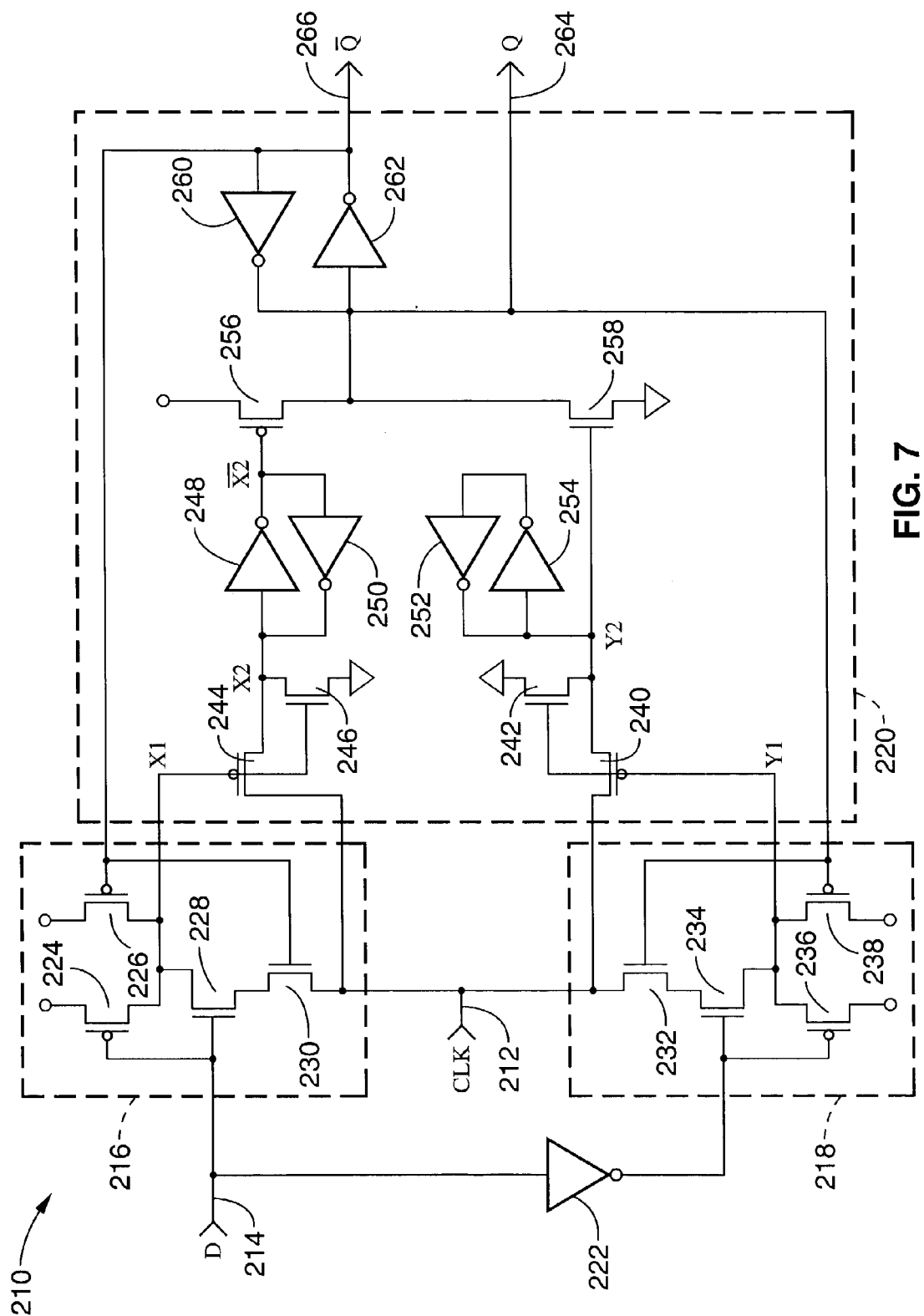
FIG. 7 is a schematic diagram of an event driven flip-flop circuit according to the present invention shown utilizing a first type of clock path control circuits to reduce losses associated with the charging and discharging of gate capacitances.

FIG. 7 exemplifies a flip-flop circuit 210 that captures data at the falling or rising edge of the clock. The data flip-flop is but one example of a sequential logic circuit that may be implemented using event driven logic to reduce power consumption and the method may be generally applied to most or all forms of sequential logic circuitry.

The present method can be generalized to that of blocking transitions of the clock signal to a logic circuit unless evaluation of the states in that logic circuit indicate that a state change within the circuit is pending in response to circuit conditions. Typically, the clock signal blocking is performed in response to the relationship between the inputs and/or outputs within a simple combinatorial or sequential logic circuit, while more complex circuits could require intermediary state evaluation. In the case of a data "D" flip-flop, the evaluation determines if latched data is the same as incoming data.

Consider the situation in which the latched data differs from data input D 214, for example the latched data is low and the data input D 214 is held high. In this case transistor 224 is off while transistor 228 is on. Receiving the inverted data is transistor 236 in an on-state while transistor 234 is switched-off. Since the latched data is low, Q is low and Q-bar is high, respectively. Since Q-bar is high, transistor 226 is off while transistor 230 is switched-on. Since Q is low, transistor 238 is switched-on and transistor 232 is switched-off. Therefore, Y1 is held high while transistor 240 is switched-off, with transistor 242 being on.

When CLK 212 is low (precharge phase), node X1 is discharged to low through transistors 228 and 230, while transistor 244 is switched-on. After the previous circuit operation, node X2 and Y2 are set low by transistor 246 and transistor 242, respectively, with X2-bar being set high. Therefore, through inverters 248, 250 the transistor 256 is switched-off. The output of transistor 240 is directed to transistor 258 which is switched-off. It will be appreciated that inverter pairs 248 and 250 along with 252, 254 prevent nodes X2 and Y2 from floating, and retain those nodes low. The latched data at Q and Q-bar are isolated from the evaluation circuit (left part). With transistor 244 switched-on, as clock signal CLK 212 goes high node X2 and X2-bar transition to high and low, respectively, and transistor 256 is switched-on. Therefore, the data at node Q is changed from low (previous data) to high (new data).

Since transistor 240 is switched-off and node Y2 is maintained low through pull-down transistor 242, then transistor 258 is switched-off and there is no static current. After the output data is changed to high, transistor 238 is switched-off and transistor 232 is switched-on. Since Q-bar is changed to low, transistor 226 becomes switched-on while transistor 230 is switched-off. It should be noted, however, that CLK is still high and node Y1 is floating when input D is changed to low (an "invalid" data transition) so a latch (inverter 252 and 254) is necessary to keep node Y2 low. Therefore, node X1 goes to high and transistor 244 is switched-off while pull down transistor 246 is switched-on. Hence, node X2 is de-coupled from clock signal CLK 212 and discharged to $V_{SS}$ (low) through transistor 246. Node X2-bar is set high to turn off transistor 256. As a result, the latched outputs at Q and Q-bar are isolated from the remainder of the circuit.

Subsequent to output Q 264 assuming a high state, if data input D 214 is still in the same state as in the previous cycle, node Y1 remains high in response to transistor 236 while transistor 240 is switched-off. Node Y2 is maintained low by transistor 242 wherein transistor 258 is switched-off. Node X1 is set high by transistor 226 since Q-bar is low and transistor 244 is switched-off. Nodes X2 and X2-bar remain low and high, respectively and transistor 256 is switched-off. Since transistors 244 and 240 are switched-off even after CLK 212 goes to high, it will be appreciated that charging and discharging of the gate capacitance, as shown in the conventional flip-flop, does not occur within the event-driven flip-flops according to the invention.

Figure 8:
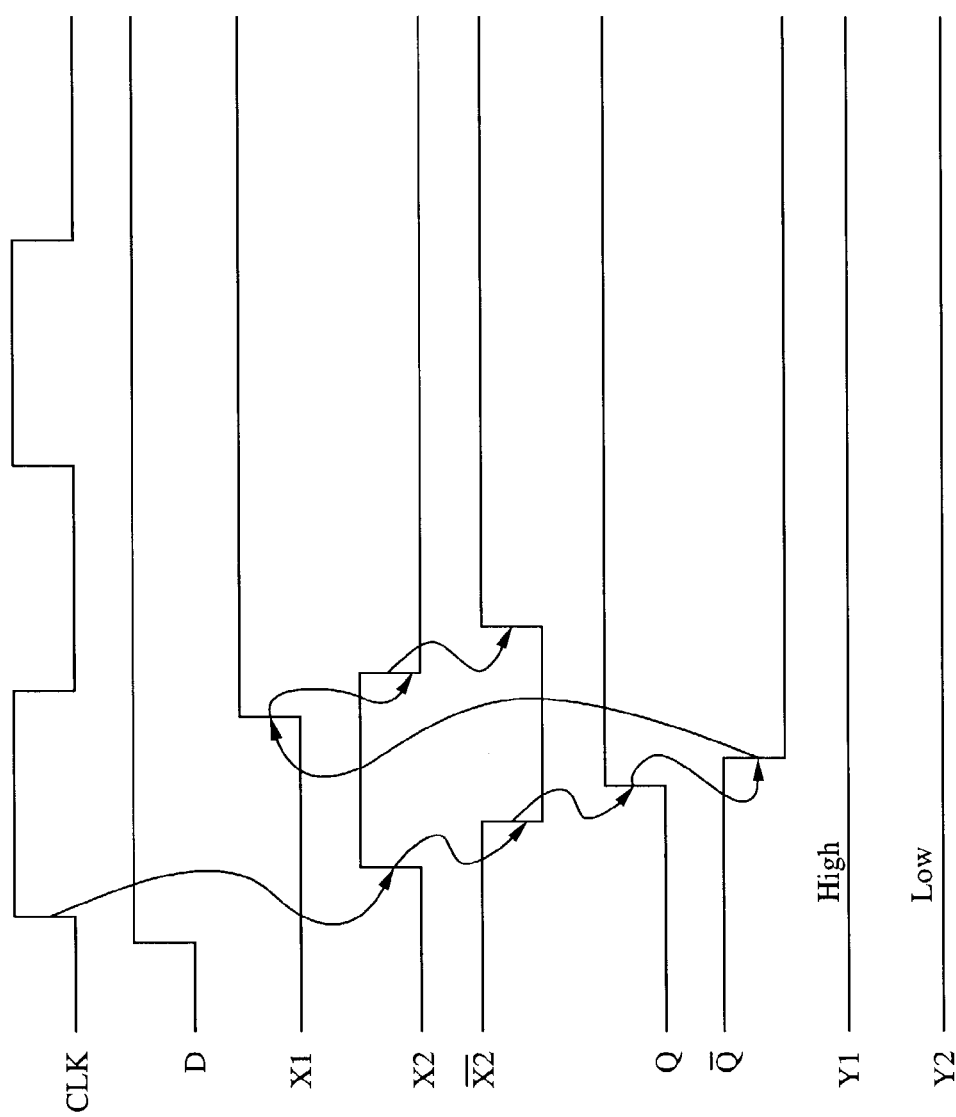
FIG. 8 is a timing diagram for the flip-flop circuit depicted in FIG. 7.

A timing diagram for the event driven data flip-flop when input D is high is depicted in FIG. 8. Relationships are highlighted as the clock enters the evaluation phase with the X and Y nodes and the associated Q and Q-bar outputs.

Figure 3:
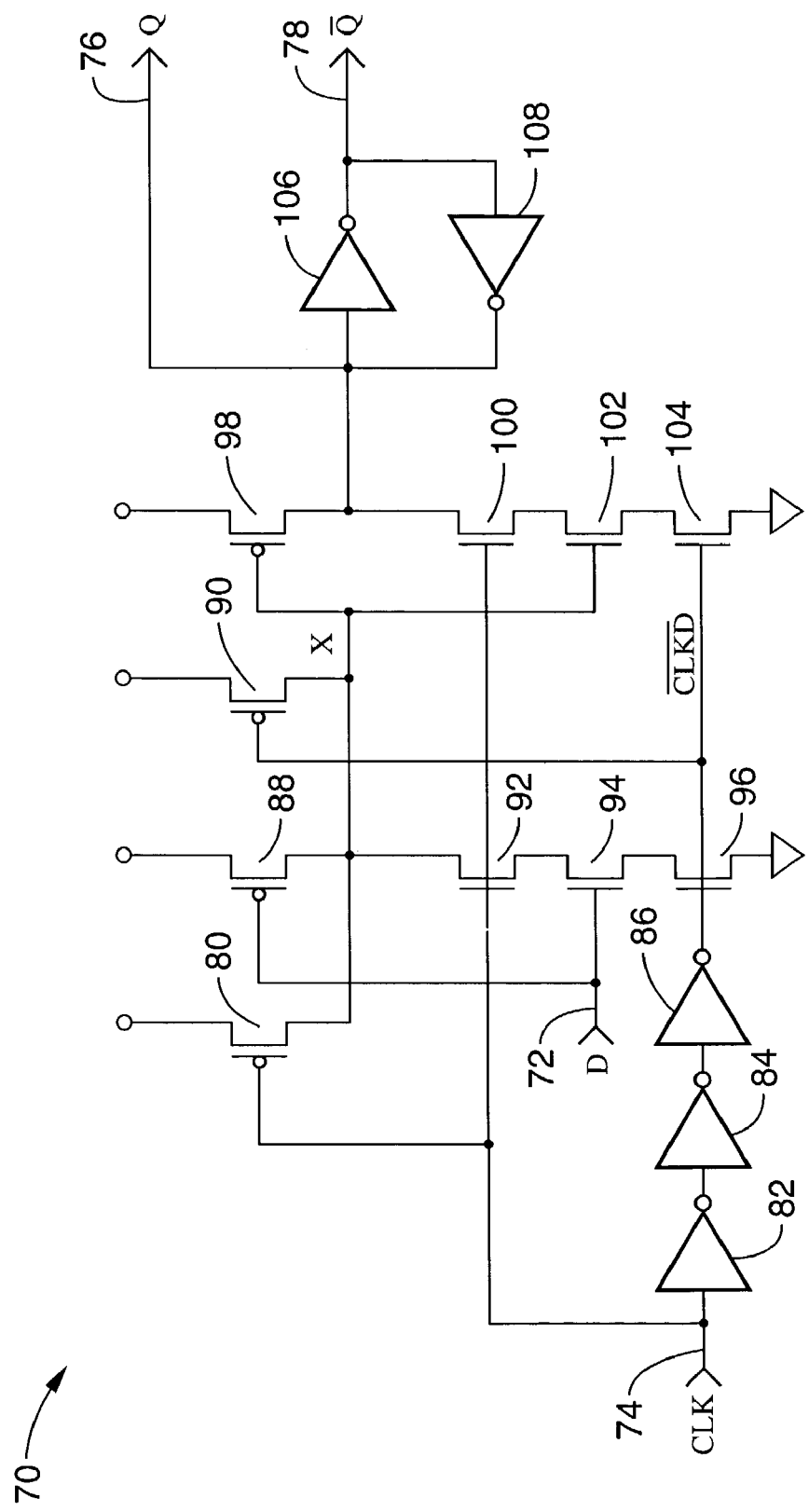
FIG. 3 is a schematic diagram of a conventional flip-flop structure (D-FF) implemented in dynamic logic.

Unnecessary clock power consumption within the present event driven D flip-flop is eliminated when the latched data is the same as the input data, thereby reducing overall power consumption. Compared to the conventional flip-flop, circuit operating speed can be improved by virtue of using a non-stacked circuit structure. In the conventional flip-flop of FIG. 3, node X is discharged through three stacked transistors (92, 94 and 96, or 100, 102 and 104). Typically, data is set up earlier than the clock to meet a predetermined minimum set-up time. Therefore, referring once again to FIG. 7, before CLK goes to high, either transistor 244 or transistor 240 is switched-on. When CLK goes high, the CLK signal rapidly propagates through non-stacked logic, inverter 248 and transistor 256 or 258. Therefore, the data latching speed can be improved by a factor of about thirty percent (30%).

When data input D 214 is held low after Q and Q-bar have changed to high and low, respectively, then node Y1 is discharged to $V_{SS}$ (low) through transistor 232 and transistor 234, when CLK is low and transistor 240 is switched-on. Node X1 is set high through transistor 224, and transistor 244 is switched-off. When clock signal CLK 212 transitions to high, node Y2 transitions to high and transistor 258 switches on. Node Q is thereby discharged to $V_{SS}$ (low) and Q-bar becomes high. Upon Q going low, node Y1 transitions to high and transistor 240 is switched-off. Node Y2 is discharged to $V_{SS}$ and transistor 258 is switched-off. When Q-bar goes high, transistor 230 goes high and node X1 goes low when clock input CLK 212 goes to low when the data input D 214 is high. In this case, transistor 244 is switched-on and the output is changed at the rising edge during the following cycle.

In summary, the event driven data flip-flop according to this embodiment of the invention, is composed of a data latch portion (inverters 260 and 262), the driver portion (transistors 256 and 258), the clock path control portion (transistors 224, 226, 228 and 230 for input data D 214 being high and transistors 236, 238, 232 and 234 for input data D 214 being low), and the driver control portion. The clock path control portion receives information of the latched data (Q or Q-bar) and input data D 214 and is activated only when the latched data and input data are different from one another so as to eliminate unnecessary clock power consumption.

Following a low data input D 214 being latched at Q, only a transition of data input D 214 to high causes the clock path control circuit to respond by allowing clock transitions to pass, and thereby enabling the driver to change the output Q 264 from low to high.

Figure 9:
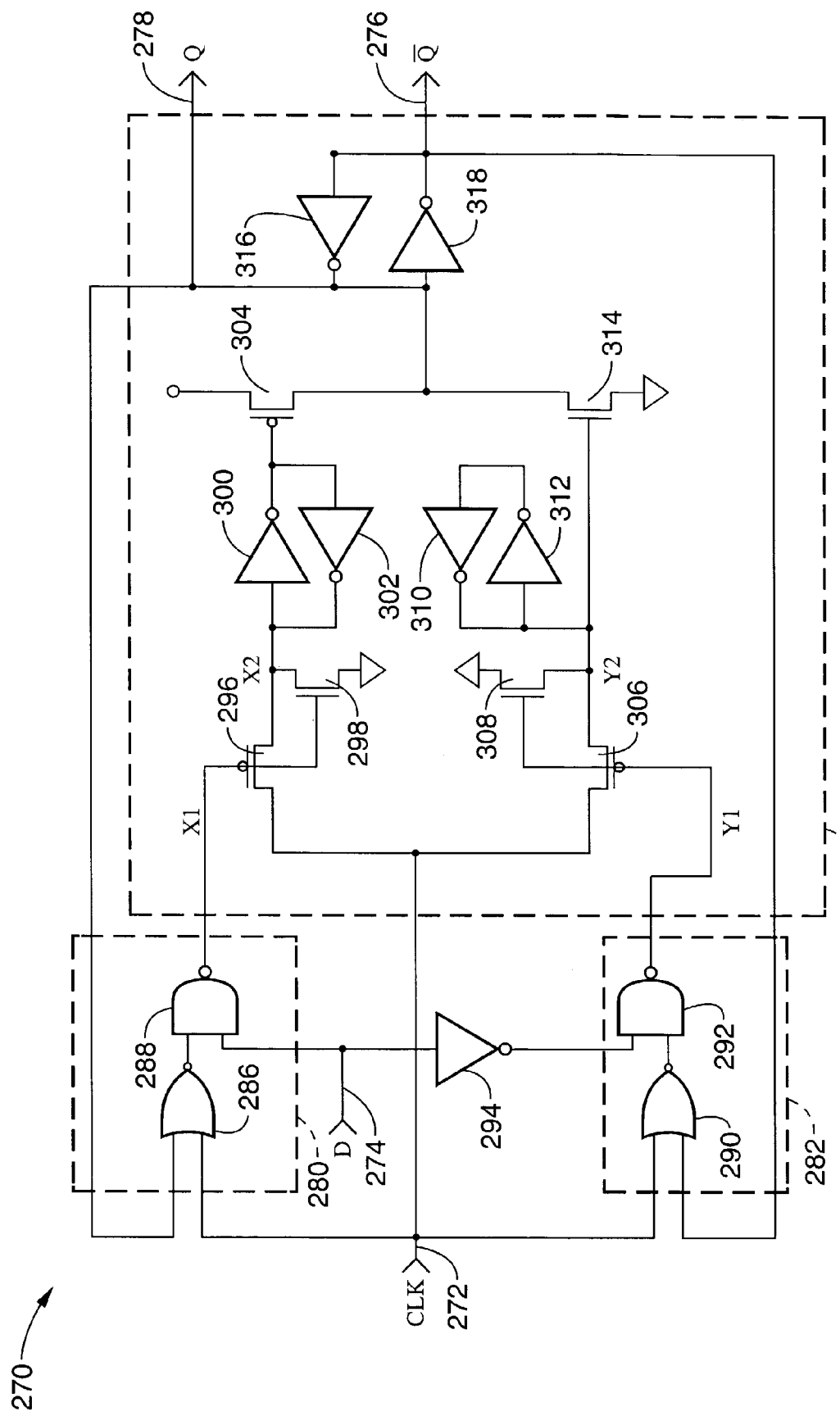
FIG. 9 is a schematic diagram of an event driven flip-flop circuit according to the present invention shown utilizing an alternative clock path control circuit to reduce losses associated with the charging and discharging of gate capacitances.

FIG. 9 by way of further example depicts another embodiment of event-driven flip-flops 270. This embodiment of event driven sequential devices utilizes different clock path control circuits 280, 282 to increase the set-up time margin. In the previous event driven flip-flop of FIG. 7 the data needed to be set up earlier than the clock, as in a typical design, to assure safe circuit operation. However, in the flip-flop shown in FIG. 9, the data input D 274 may be set up later than the clock signal CLK 272 by an amount given as one NOR-gate delay. This embodiment of the circuit can therefore operate safely despite a negative set-up time condition. This feature is particularly beneficial in speed critical applications, such as constructing faster pipeline architectures using what is generally referred to as a "time-borrowing" technique.

A significant benefit of event-driven (ED) logic is the elimination of unnecessary circuit and clock power consumption by using clock path control circuits as described herein. When clock path control circuits are applied to dynamic logic, the clock signal is only utilized for precharging internal nodes in response to a positive evaluation of the logic states in anticipation of a useful (productive) state change. In applying eventdriven (ED) logic to flip-flops, the clock path control circuits enable a path to change the output data only when the data input does not correspond with the data latched from a prior cycle. In general, the clocking is only passed through to the logic circuit when a change of state of the logic circuit may arise, as determined during the evaluation phase. The determination performed during the evaluation phase may take into account any of the relationships between the input signals and both the intermediate and output states of the logic circuit.

Accordingly, it will be seen that this invention provides a method for implementing event driven logic, exemplified by a number of embodiments showing both combinatorial and sequential logic circuits. The method and circuits may be applied within any devices containing logic circuitry, and are particularly well suited for use within integrated circuits. The power reduction method described may also be utilized with devices produced by a number of different fabrication processes.

Despite the example embodiments describing circuits having a single output, it should be readily appreciated that the method and circuits described within the invention are applicable to combinatorial and/or sequential logic circuits having any number of inputs and outputs and which are subject to an assortment of intermediate logic circuitry.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. An apparatus for reducing circuit power consumption within a clocked logic circuit, comprising:
   a first logic circuit;
   a second logic circuit receiving a clock signal through said first logic circuit; and
   means for blocking passage of a clock signal within said first logic circuit to said second logic circuit as a function of a feedback signal received from said second logic circuit; and
   means for modulating the clock signal at the clock signal input of said second logic circuit when passage of said clock signal is not being blocked by said first logic circuit.

2. An apparatus as recited in claim 1, wherein said means for blocking passage of a clock signal through said first logic circuit is configured to pass said clock signal through said first logic circuit to said second logic circuit only in response to conditions detected in said second logic circuit in which receipt of said clock signal can effect a desired change in state of said second logic circuit.

3. An apparatus as recited in claim 1, wherein said means for blocking passage of a clock signal does not pass said clock signal to the clock input of said second logic circuit when conditions are detected in said second logic circuit in which receipt of said clock signal by said second logic circuit would be incapable of producing a desired change of state within said second logic circuit.

4. An apparatus as recited in claim 1, wherein said second logic circuit comprises a combinatorial or sequential logic circuit.

5. An apparatus as recited in claim 1, wherein said second logic circuit is implemented within the circuitry of an integrated circuit.

6. An apparatus as recited in claim 1, wherein said means for blocking the passage of a clock signal, comprises:
   a switching circuit configured for selectively blocking said clock signal from receipt by said second logic circuit; and
   a detection circuit configured for modulating said switching circuit to block said clock signal if a change in state of said second logic circuit could not arise in response to receipt of said clock signal.

7. An apparatus as recited in claim 1, wherein said means for modulating the clock signal at the clock signal input comprises a circuit for reducing the signal amplitude of the clock signal for receipt by said first logic circuit.

8. An apparatus as recited in claim 7, wherein said circuit comprises a transistor coupled in a pass configuration whose gate is coupled to a reference voltage selected for shifting the voltage level of the clock signal received by said first logic circuit.

9. An apparatus as recited in claim 1, wherein said first logic circuit comprises a clock pass circuit and a first pull up transistor gated by said feedback signal received from said second logic circuit and configured to pull up the clock signal prior to receipt by said second logic circuit; and
wherein said means for reducing power losses comprises a second pull up transistor whose gate is coupled to the inverse of said feedback signal thereby eliminating a floating condition.

10. An apparatus as recited in claim 9, wherein said second pull up is configured to allow sufficient current flow for retaining the voltage at the clock input of the second logic circuit without preventing precharge operations.

11. An apparatus as recited in claim 10, wherein said second pull up is configured to have reduced transistor width compared to said first pull up thereby limited transistor conductance.

12. An apparatus for reducing circuit power consumption within a clocked digital logic circuit, comprising:
a clock path control circuit configured to pass a clock signal to a clock input of said clocked digital logic circuit as a function of feedback received from said clocked digital logic circuit;
a first switching circuit, including at least one first transistor having at least one input, within said clock path control circuit configured for selectively passing said clock signal to said clock input of said clocked digital logic circuit;
means for determining whether receipt of said clock signal at said clock input of said clocked digital logic circuit could create a desired change of state within said clocked digital logic circuit; and
means for modulating the clock signal at the clock signal input of said clocked digital logic circuit while said clock signal is being passed to said clock signal input to reduce power dissipation.

13. An apparatus as recited in claim 12, wherein said means for modulating the clock signal comprises a circuit for reducing the signal amplitude of the clock signal for receipt by said digital logic circuit.

14. An apparatus as recited in claim 13, wherein said circuit comprises:
a transistor coupled in a pass configuration whose gate is coupled to a reference voltage selected for shifting the voltage level of the clock signal received by said digital logic circuit.

15. An apparatus as recited in claim 12:
wherein said modulating the clock signal comprises a circuit for pulling said clock input of said clocked digital logic circuit toward a predetermined voltage state in response to the passage of said clock signal by said first switching circuit; and
wherein said circuit is configured to allow sufficient current flow for retaining the voltage at the clock input of the second logic circuit without preventing precharge operations.

16. An apparatus as recited in claim 12, further comprising a second switching circuit configured for pulling said clock input of said clocked digital logic circuit toward a predetermined voltage state in response to the blockage of said clock signal by said first switching circuit.

17. An apparatus as recited in claim 16, wherein said second switching circuit comprises at least one second transistor connected between said clock input of said clocked digital logic circuit and a predetermined voltage, said transistor being activated in response to blocking of said clock signal by said first switching circuit.

18. An apparatus as recited in claim 12:
wherein said means for determining comprises at least one electrical connection between a control input of said first switching circuit and said clocked digital logic circuit;
wherein the activation of said switching circuit is modulated in response to conditions detected within said clocked digital logic circuit.

19. An apparatus as recited in claim 12, wherein said means for determining comprises a detection circuit configured for modulating the state of said switching circuit in response to conditions detected within said clocked digital logic circuit.

20. An apparatus as recited in claim 12, wherein said detection circuit comprises a logic circuit configured for determining the state of the output of said clocked digital logic circuit.

21. An apparatus as recited in claim 20, further comprising additional logic circuits within said detection circuit which are configured for comparing said output state with one or more inputs of said clocked digital logic circuit.

22. A digital logic circuit, comprising:
a plurality of interconnected switching elements configured for executing a logic function in response to a clock signal transition received at a clock input;
a clock switching circuit configured to selectively pass said clock signal to said clock input of said interconnected switching elements;
a detector coupled to said clock switching circuit for controlling the selective pass state of said clock switching circuit;
a level translating circuit for reducing the signal amplitude of the clock signal when it passes through said clock switching circuit; and
wherein said detector is configured for setting said clock switching circuit into a high impedance mode in response to detecting conditions within said interconnected switching elements under which a desired change in state of said interconnected switching elements would not arise in response to the receipt of said clock signal.

23. A digital logic circuit as recited in claim 22, wherein said level translating circuit comprises a transistor coupled in a pass configuration whose gate is coupled to a reference voltage selected for shifting the voltage level of the clock signal received by said interconnected switching elements of the logic function.

24. A digital logic circuit as recited in claim 22, wherein said detector comprises a logic circuit configured for determining one or more intermediate, or output, states of said digital logic circuit.

25. A digital logic circuit as recited in claim 24, further comprising additional logic circuits within said detector for comparing said intermediate or output states with one or more inputs of said clocked digital logic circuit, the result of which drives the selection of said clock switching circuit.

26. A digital logic circuit as recited in claim 22, wherein said detector is configured for activating said clock switching circuit for passing said clock signal to the clock input of said interconnected switching elements in response to satisfying input conditions and intermediate conditions necessary to create a desired change of intermediate or output states within said digital logic circuit.

27. A digital logic circuit as recited in claim 22, wherein said detector is configured for activating said clock switching circuit for passing said clock signal to the clock input of said interconnected switching elements in response to satisfying input conditions from which a desired output state within said digital logic circuit can arise.

28. A digital logic circuit within which state changes are initiated upon receipt of a clock signal transition, comprising:
   a plurality of interconnected switching elements configured for executing a logic function in response to a clock transition received on a clock signal input; and
   a clock path control circuit configured for blocking the receipt of said clock transition on said clock input by said plurality of interconnected switching elements in response to circuit states detected within said plurality of interconnected switching elements;
   wherein said clock path control circuit is configured with at least one switching element, having a low impedance state through which said clock signal must pass prior to receipt by said clock signal input, and a high impedance state through which said clock signal is blocked from receipt by said clock signal input;
   a first pull up comprising at least one transistor configured for pulling said clock signal toward a predetermined voltage state when said clock signal is not being passed to said clock signal input of said interconnected switching elements; and
   a second pull up comprising at least one transistor configured for pulling said clock signal toward said predetermined voltage state when said clock signal is being passed to said clock signal input of said interconnected switching elements;
   wherein said second pull up is configured to allow sufficient current flow for retaining the voltage at the clock input of the second logic circuit at the transition of said clock signal without preventing dynamic logic precharging.

29. A digital logic circuit as recited in claim 28, wherein said clock path control circuit is configured for detecting circuit state in response to relationships that exist between input, output, and intermediate signal and node states within said interconnected switching elements.

30. A digital logic circuit as recited in claim 28, wherein said plurality of interconnected switching elements comprises a dynamic logic circuit in which the clock controls a precharge phase and evaluation phase for triggering state changes within said plurality of interconnected switching elements.

31. A digital logic circuit as recited in claim 30, wherein said precharge and evaluation phase within said plurality of interconnected switching elements are controlled by complementary circuits operating in response to said clock signal for charging a circuit node from a first circuit during precharge, and then allowing the charge to be dissipated or held during said evaluation phase through a second circuit in response to said received clock signal.

32. A digital logic circuit as recited in claim 28, wherein said digital logic circuit comprises a combinatorial logic circuit.

33. A digital logic circuit as recited in claim 32, wherein state changes of said combinatorial logic circuit occur in response to receiving transitions of said clock signal as received on said clock input.

34. A digital logic circuit as recited in claim 28, wherein said digital logic circuit comprises a sequential logic circuit.

35. A digital logic circuit as recited in claim 34, wherein said sequential logic circuit is configured for receiving said clock signal on said clock input of said sequential logic circuit for controlling the latching of signal states within said sequential logic circuit.

36. A digital logic circuit as recited in claim 35, wherein said sequential logic circuit is configured for activating the sequential logic function of the sequential digital logic circuit in response to receipt of said clock signal.

37. A digital logic circuit as recited in claim 28, wherein said interconnected switching elements comprise transistors.

38. A digital logic circuit as recited in claim 37, wherein said transistors are fabricated within one or more predetermined device processes within an integrated circuit.

39. A digital logic circuit as recited in claim 38, wherein said device process comprises a CMOS fabrication process.

40. A method of lowering power dissipation in a digital logic circuit stage configured for receiving a clock signal on a clock signal input for triggering state transitions within said digital logic circuit stage, comprising:
   (a) determining that state transitions within said digital logic circuit stage could not occur in response to receiving a clock signal on said clock signal input under a given set of conditions within said digital logic circuit stage;
   (b) isolating said clock signal from said clock signal input of said digital logic circuit stage in response to at least a portion of said conditions for which said state transitions within said digital logic circuit stage could not occur; and
   (c) modulating the clock signal input to reduce capacitive or leakage current when said clock signal is not being isolated.

41. A method as recited in claim 40, wherein said isolating of said clock signal comprises:
   blocking said clock signal to prevent it from being received on said clock signal input by said digital logic circuit stage; and
   pulling said clock signal input of said digital logic circuit stage toward a predetermined voltage state to prevent signal float.

42. A method as recited in claim 41, wherein said blocking of said clock signal comprises gating off a pass transistor through which said clock signal must pass prior to connecting to said clock signal input.

43. A method as recited in claim 40, wherein said modifying of said clock signal comprises lowering the signal amplitude of said clock signal toward reducing capacitive current losses, and/or pulling up said clock signal to prevent float during transitions of said clock signal.

44. A method of reducing power dissipation within a digital logic circuit stage whose state transitions are triggered in response to clock signal transitions received on a clock signal input, comprising:
   (a) detecting conditions within said digital logic circuit stage under which circuit activity may occur in response to receiving a clock transition;
   (b) communicating said clock to said digital logic circuit stage in response to said conditions being detected, and otherwise blocking said clock signal, whereby overall gate capacitance loading associated with said clock transitions are reduced; and (c) modulating said clock signal input when said clock signal is being communicated to said digital logic circuit stage by level shifting to reduce clock signal amplitude toward reducing capacitive power losses, and/or by sufficiently pulling up the clock signal level to eliminate a floating condition at the input of said digital logic circuit stage.

45. A method as recited in claim 44, wherein said pulling up of said clock signal allows sufficient current to flow for retaining the voltage at the clock input of the digital logic circuit stage without preventing precharge operations.

46. A method as recited in claim 45, wherein said pulling up of said clock signal comprises reducing the width of a pull up transistor for limiting transistor conductance, said transistor being activated in response to the communication of said clock signal to said digital logic circuit stage.

47. In a digital logic circuit configured for triggering intermediate or output state transitions in response to the receipt of a clock signal transition, the improvement comprising:

a clock path control circuit configured to prevent clock signal in a clock blocking mode, from being received by said digital logic circuit if the signal states, detected by said clock path control circuit within said digital logic circuit, indicate that no desired state changes will arise in said digital logic circuit as a result of receiving said clock signal transitions; and modulating said clock signal as received by said digital logic circuit when said clock path control circuit is not in blocking mode by level shifting to reduce clock signal amplitude toward reducing capacitive power losses, and/or by sufficiently pulling up the clock signal level to eliminate a floating condition at the input of said digital logic circuit stage.

48. An improvement as recited in claim 47, wherein said clock path control circuit comprises:

a clock switching element; and
means for modulating the conduction state of said clock switching element in response to determining whether said desired state change would arise in said digital logic circuit if said clock signal transitions were received by said digital logic circuit.

49. An improvement as recited in claim 47, wherein said clock path control circuit is implemented within an integrated circuit.

50. An improvement as recited in claim 47, wherein said clock path control circuit along with said digital logic circuit are implemented within an integrated circuit.

51. An improvement as recited in claim 47, wherein said desired state changes comprise output state changes, intermediate circuit state changes, or node voltage changes.

52. An improvement as recited in claim 51, wherein said intermediate circuit state changes comprise state changes that occur on circuits which are not directly reflected on the outputs or inputs of said digital logic circuit.

53. An improvement as recited in claim 51, wherein said node voltage changes comprise node voltage changes that occur during precharging in response to said clock transition.

54. An improvement as recited in claim 47, wherein said clock path control circuit is configured to detect signal state by evaluating at least one input, intermediary state, or output state within said digital logic circuit to determine if a desired state change could result from the receipt of a clock signal.

55. An improvement as recited in claim 47, wherein said clock path control circuit is configured to detect signal state by comparing any combination of output states, intermediate circuit states, and node voltage states to determine if a desired state change could result from receiving said clock signal.

56. A digital logic circuit configured to reduce unnecessary capacitive charging and discharging of circuit nodes within said logic circuit by a clock input, comprising:

a plurality of interconnected switching elements configured for executing a logic function in response to clock signal transitions;

means for blocking said clock signal from being received by said plurality of interconnected switching elements in response to a true logic evaluation; and means for modulating said clock signal as received by said plurality of interconnected switching elements when not subject to blocking, by level shifting to reduce clock signal amplitude toward reducing capacitive power losses, and/or by sufficiently pulling up the clock signal level to eliminate a floating condition at the input of said plurality of interconnected switching elements.

57. A digital logic circuit as recited in claim 56, wherein said means for modifying comprises:

a pull up transistor which is activated when said blocking means is inactive; and wherein said pull up transistor is configured to allow sufficient current flow for retaining the voltage at the clock input of the plurality of interconnected switching elements without preventing precharge operations.

58. A digital logic circuit as recited in claim 56, wherein means for blocking said clock signal comprises:

a clock switching circuit for controlling the passage of said clock signal to said interconnected switching elements; and means for modulating the state of said clock switching circuit to block the passage of said clock signal to said plurality of interconnected switching elements in response to at least one state detected within said plurality of interconnected switching elements.

59. A digital logic circuit as recited in claim 58, wherein said means for modulating the state of said clock switching circuit comprises at least one electrical connection between said clock switching circuit and a selected input, output, or intermediate node within said plurality of interconnected switching elements.

60. A digital logic circuit as recited in claim 58, wherein said means for modulating the state of said clock switching circuit comprises a detector circuit configured to modulate the state of said clock switching circuit in response to a combination of input, output, and intermediate node states detected within said interconnected switching elements.

61. A digital logic circuit as recited in claim 56, wherein said true logic evaluation comprises a logic evaluation that determines whether receipt of said clock signal in response to the current input, intermediate, and output, states of said plurality of interconnected switching elements can lead to a desired change of state for said plurality of interconnected switching elements.

62. A digital logic circuit as recited in claim 56, wherein said plurality of interconnected switching elements implement a combinatorial logic function to which said clock signal is blocked if the current combination of input states to the combinatorial logic function would not alter the output state of the combinatorial logic function in response to receipt of said clock signal transition.

63. A digital logic circuit as recited in claim 56, wherein said plurality of interconnected switching elements implement a sequential logic function to which said clock signal is blocked if the receipt of said clock signal could not contribute to desired advancement of the state of said sequential logic function based on current input states and intermediate states within said sequential logic function toward a new output state for said sequential logic function.

64. A digital logic circuit as recited in claim 63, wherein said sequential logic function comprises a flip-flop circuit to which said clock is transferred only when the input signal of said flip-flop differs from a non-complementary latched output of said flip-flop.

65. A dynamic logic circuit, comprising:
at least one transistor receiving a data signal from at least one data input;
a gating circuit coupled to the output of said transistor and configured for receiving a clock signal on a clock input to trigger a change of state in a data output based on said data input;
a clock blocking circuit configured to selectively prevent the passage of said clock signal to said gating circuit in response to the state of said data output; and
a clock modification circuit configured to modify said clock signal which is communicated to said gating circuit by level shifting to reduce clock signal amplitude toward reducing capacitive power losses, and/or by sufficiently pulling up the clock signal level to eliminate a floating condition at the input of said gating circuit.

66. A dynamic logic circuit as recited in claim 65:
wherein at least two transistors are configured to receive data signals from respective data inputs;
wherein said gating circuit is configured to change the state of said data output according to a logic function relating the multiple of said data signals on said data inputs when triggered by said clock signal.

67. A dynamic logic circuit as recited in claim 66, wherein said logic function is selected from the group of combinatorial logic functions consisting of: inverting buffer, non-inverting buffer, AND gate, NAND gate, OR gate, NOR gate, XOR gate, coincidence gate, and combinations thereof.

68. A dynamic logic circuit as recited in claim 65, wherein said clock blocking circuit is further configured to selectively prevent the passage of said clock signal to said gating circuit in response to the state of said data output in combination with said data input.

69. A dynamic logic circuit as recited in claim 65, wherein said clock modification circuit is comprising a level shifter circuit preceding said gating circuit and configured for lowering the amplitude of said clock signal prior to receipt upon said clock input of said gating circuit.

70. A dynamic logic circuit as recited in claim 69, wherein said level shifter circuit comprises a transistor through which said clock signal is passed, and which is driven to a sufficient impedance to reduce the amplitude of said clock signal prior to receipt at said gating circuit.

71. A dynamic combinatorial logic circuit, comprising:
a plurality of transistors arranged in a series, ANDed, configuration each receiving a data signal through an associated data input;
a gating circuit having complementary transistors on either end of said plurality of series arranged transistors and configured for generating an output signal responsive to the ANDed combination of said plurality of transistors upon receipt of a clock signal transition;
a clock blocking circuit configured to selectively prevent the passage of said clock signal to said gating circuit in response to the state of said output signal; and
a clock modification circuit configured to modify said clock signal as passed to said gating circuit by level shifting to reduce clock signal amplitude toward reducing capacitive power losses, and/or by sufficiently pulling up the clock signal level to eliminate a floating condition at the input of said gating circuit.

72. A dynamic logic circuit as recited in claim 71, further comprising an inverting, or non-inverting, buffer connected to said output signal from said gating circuit.

73. A dynamic logic circuit, comprising:
a bistable circuit having at least one data output responsive to a data signal received on a data input when triggered by a clock signal transition on a clock input;
said bistable circuit being configured for retaining and generating a logic state as previously set in response to the state of said data input in response to the previous receipt of a clock input transition;
a clock path control circuit coupled to said bistable circuit and configured to block the receipt of said clock signal transition in response to the relationship between the signals at said data input and said data output; and
a clock modification circuit configured to modify said clock signal communicated to, and not blocked from, said gating circuit by level shifting to reduce clock signal amplitude toward reducing capacitive power losses, and/or by sufficiently pulling up the clock signal level to eliminate a floating condition at the input of said gating circuit.

74. A dynamic logic circuit as recited in claim 73, wherein said clock path control circuit is configured to respond to a relationship of equivalence between the signals at said data input and said data output.

75. A dynamic logic circuit as recited in claim 73, wherein said clock path control circuit comprises at least one first transistor configured to enter a sufficiently high impedance mode to block the receipt of said clock signal on said clock input of said bistable circuit.

76. A dynamic logic circuit as recited in claim 75, further comprising at least one second transistor connected to said clock input of said bistable circuit to bias this input toward a desired logic state.

77. A dynamic logic circuit as recited in claim 76, wherein said biasing of said clock input of said bistable circuit is performed in response to said output signal generated by said bistable circuit.

78. A dynamic logic circuit as recited in claim 75, wherein said clock modification circuit is comprising a level shifter circuit preceding said clock path control circuit for varying the amplitude of said clock signal prior to receipt upon said clock input of said clock path control circuit.

79. A dynamic logic circuit as recited in claim 78, wherein said level shifter circuit comprises a transistor through which said clock signal is passed, and which is driven to a sufficient impedance to reduce the amplitude of said clock signal prior to receipt at said clock input of said clock path control circuit.

* * * * *